US008525611B2

(12) United States Patent
Tabatabai

(10) Patent No.: US 8,525,611 B2
(45) Date of Patent: *Sep. 3, 2013

(54) ENHANCED ELECTROMAGNETIC COUPLING BETWEEN A TRANSMISSION LINE PAIR WITH REDUCED ELECTROMAGNETIC COUPLING TO GROUND

(75) Inventor: Mohammad Tabatabai, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/400,965

(22) Filed: Feb. 21, 2012

(65) Prior Publication Data

US 2012/0146748 A1 Jun. 14, 2012

Related U.S. Application Data

(63) Continuation of application No. 12/384,943, filed on Apr. 10, 2009, now Pat. No. 8,125,289.

(51) Int. Cl.
*H01P 3/08* (2006.01)
(52) U.S. Cl.
USPC .............................. 333/4; 333/238

(58) Field of Classification Search
USPC ...................... 333/1, 4, 5, 116, 238
See application file for complete search history.

(56) References Cited

U.S. PATENT DOCUMENTS

| 5,027,088 A | * | 6/1991 | Shimizu et al. | 333/1 |
| 6,677,831 B1 | * | 1/2004 | Cheng et al. | 333/34 |
| 6,797,891 B1 | * | 9/2004 | Blair et al. | 174/268 |
| 8,125,289 B2 | * | 2/2012 | Tabatabai | 333/4 |
| 2003/0179049 A1 | * | 9/2003 | Goergen | 333/1 |

* cited by examiner

*Primary Examiner* — Benny Lee
(74) *Attorney, Agent, or Firm* — Farjami & Farjami LLP

(57) ABSTRACT

According to one exemplary embodiment, a circuit board for reducing dielectric loss, conductor loss, and insertion loss includes a pair of transmission lines. The pair of transmission lines has sufficient thickness to cause substantial broadside electromagnetic coupling between the pair of transmission lines, where the pair of transmission lines is sufficiently separated from a ground plane of the circuit board so as to cause negligible electromagnetic coupling to the ground plane relative to the substantial broadside electromagnetic coupling. The pair of transmission lines thereby reduce dielectric loss, conductor loss, and insertion loss for signals traversing through the transmission line pair. The pair of transmission lines can be separated from the ground plane by, for example, at least 50.0 mils.

18 Claims, 5 Drawing Sheets

ENHANCED ELECTROMAGNETIC COUPLING BETWEEN A TRANSMISSION LINE PAIR WITH REDUCED ELECTROMAGNETIC COUPLING TO GROUND

This is a continuation of application Ser. No. 12/384,943 filed Apr. 10, 2009 and issued as U.S. Pat. No. 8,125,289 on Feb. 28, 2012.

BACKGROUND OF THE INVENTION

1. Field of the Invention

The present invention is generally in the field of transmission lines. More particularly, the invention is in the field of transmission lines on circuit boards.

2. Background Art

Circuit boards including transmission lines, such as transmission lines configured as differential pairs, are commonly utilized in data transmission in devices, such as optical and Ethernet devices, in communications systems. In a circuit board utilized in a communications system for data transmission, for example, a pair of transmission lines can be formed on a top surface of the circuit board, a ground plane can be formed on a bottom surface of the circuit board, and a dielectric material, such as Flame Retardant 4 (FR-4), can be utilized to insulate the transmission lines from the ground plane. However, as the speed of signals traversing the transmission lines increase, the use of a dielectric material such as FR-4 can result in, for example, increased insertion loss and dielectric loss, resulting in a loss of transmitted signal energy.

A conventional approach for reducing dielectric loss in circuit boards includes utilizing a polytetrafluoroethylene (PTFE)-based dielectric material, such as "Rogers®" (a PTFE-based material manufactured by Rogers Corporation). A PTFE-based material can have a lower dielectric loss and a lower insertion loss than FR-4, which results in a reduced signal energy loss at high data transmission speeds. Although the use of a PTFE-based material can result in reduced insertion loss and dielectric loss for high-speed signals traversing the transmission lines, PTFE-based materials can be significantly more expensive than FR-4, which can undesirably increase manufacturing cost. Also, PTFE-based dielectric materials can be less reliable than FR-4.

SUMMARY OF THE INVENTION

High speed transmission lines with enhanced coupling substantially as shown in and/or described in connection with at least one of the figures, and as set forth more completely in the claims.

DETAILED DESCRIPTION OF THE INVENTION

The present invention is directed to high speed transmission lines with enhanced coupling. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
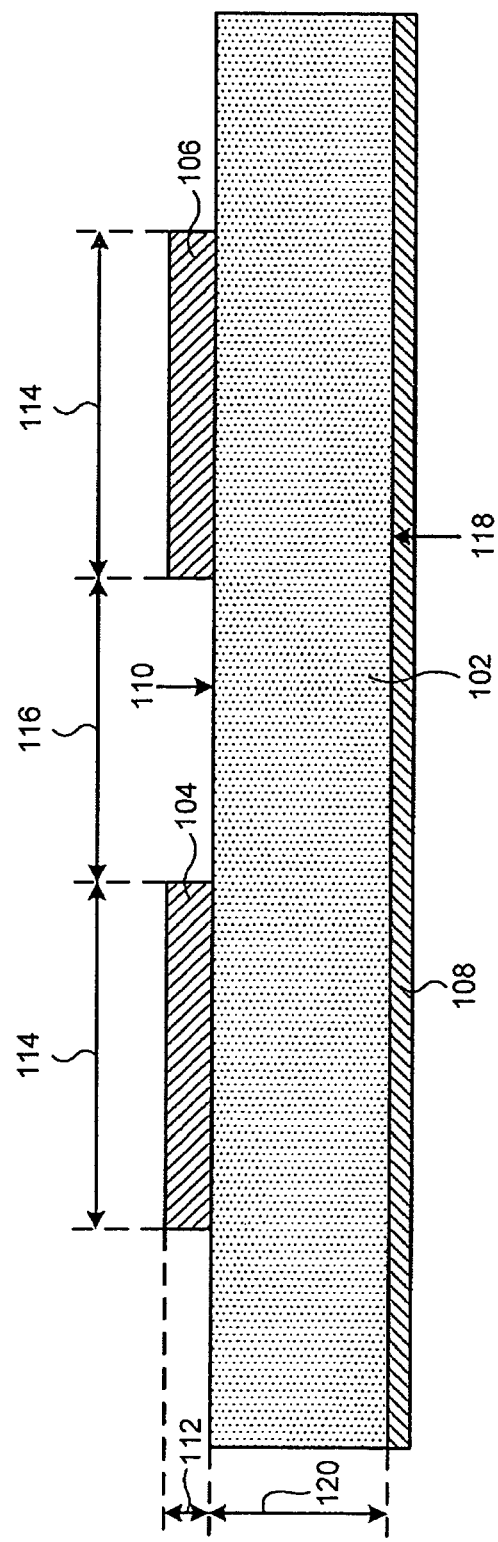
FIG. 1 illustrates a cross sectional view of an exemplary conventional circuit board including a pair of conventional transmission lines.

FIG. 1 shows a cross-sectional view of an exemplary conventional circuit board including a pair of exemplary conventional transmission lines. In FIG. 1, conventional circuit board 102 includes conventional transmission lines 104 and 106 and ground plane 108. Conventional circuit board 102 can be utilized in for high-speed data transmission in, for example, optical and Ethernet applications. As shown in FIG. 1, conventional transmission lines 104 and 106 are situated on top surface 110 of conventional circuit board 102 and are a coplanar, edge-coupled pair of transmission lines, which can be utilized in a differential pair configuration.

Conventional transmission lines 104 and 106 can comprise copper and have thickness 112 and width 114. Thickness 112 can be in a range extending from approximately 0.67 mils, which corresponds to 0.5 ounces of copper, up to approximately 1.34 mils, which corresponds to 1.0 ounces of copper. Width 114 of conventional transmission lines 104 and 106 can be between 2.0 mils and 8.0 mils. Conventional circuit board 102 can comprise a dielectric material such as, for example, FR-4 or a PTFE-based material, such as "Rogers®" (i.e. a PTFE-based material manufactured by Rogers Corporation). Conventional transmission lines 104 and 106 are separated by interpair spacing 116, which represents the edge-to-edge distance between the pair of transmission lines. Interpair spacing 116 can be equal to, for example, approximately 6.0 mils.

Also shown in FIG. 1, ground plane 108 is situated on bottom surface 118 of circuit board 102 can comprise a layer of copper, for example. Ground plane 108 is situated distance 120 from top surface 110 of conventional circuit board 102, where distance 120 can be equal to approximately 4.0 mils. In conventional circuit board 102, ground plane 108 is relied on to establish a reference plane for return current.

As the frequency of signals traversing through conventional transmission lines 104 and 106 increases, dielectric loss and insertion loss resulting from the use of the dielectric material utilized to form conventional circuit board 102 can increase significantly. To reduce the dielectric loss and insertion loss, dielectric materials having a low insertion loss and a low dielectric constant, such as PTFE-based materials (e.g. Rogers®), can be used in place of a dielectric material such as FR-4, which has a higher insertion loss and a higher dielectric constant. However, PTFE-based materials, such as Rogers®, are expensive, which undesirably increases manufacturing cost. Also, PTFE-based materials can be less reliable than FR-4.

Figure 2:
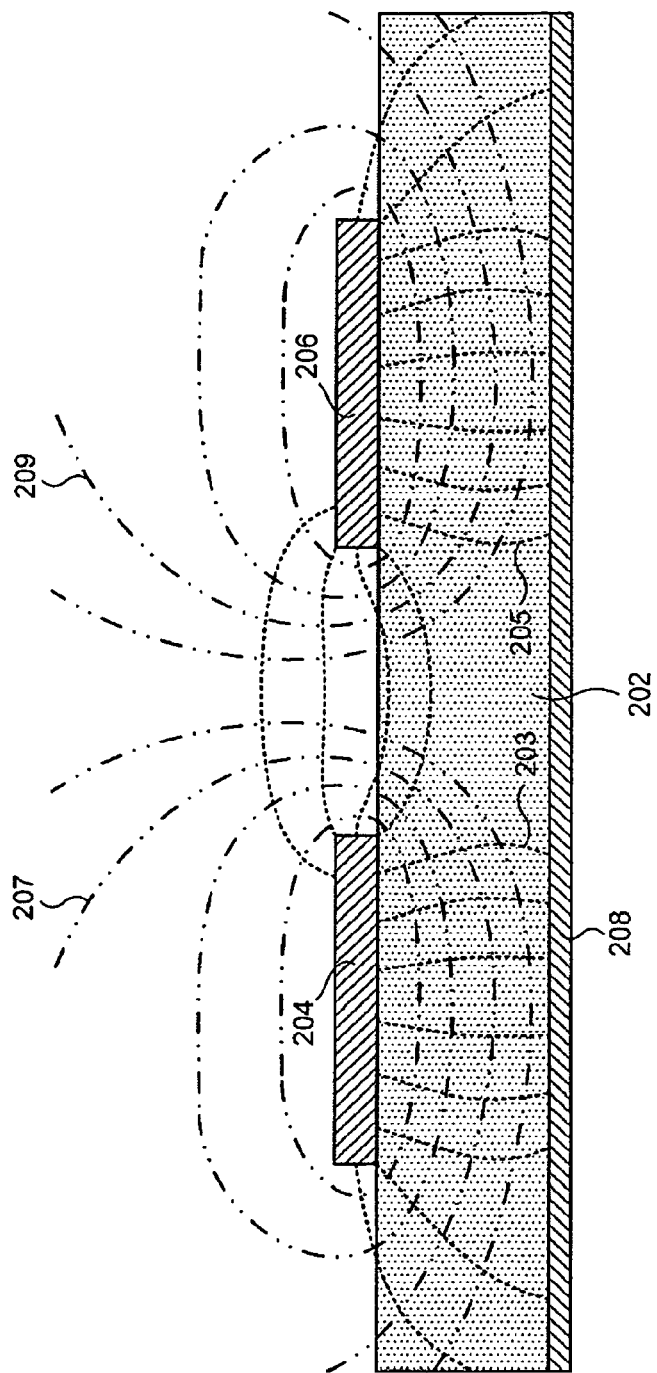
FIG. 2 illustrates a cross sectional view of an exemplary conventional circuit board including a pair of exemplary conventional transmission lines with associated electric and electromagnetic fields.

FIG. 2 shows a cross-sectional view of an exemplary conventional circuit board including a pair of exemplary conventional transmission lines with associated electric and electromagnetic fields. In FIG. 2, conventional circuit board 202, conventional transmission lines 204 and 206, and ground plane 208 correspond, respectively, to conventional circuit board 102, conventional transmission lines 104 and 106, and ground plane 108 in FIG. 1. As shown in FIG. 2, the electric and electromagnetic fields generated by conventional transmission lines 204 and 206 are not highly concentrated in the region between the transmission lines. As a result, conventional transmission lines 204 and 206 can generate an undesirably large amount of electromagnetic interference (EMI), which is indicated by electromagnetic lines that extend outwardly from conventional transmission lines 204 and 206, such as electromagnetic field lines 207 and 209.

As also shown in FIG. 2, substantial electromagnetic coupling can occur between conventional transmission lines 204 and 206 and ground plane 208, as indicated by a large number of electromagnetic field lines, such as electromagnetic field lines 203 and 205 extending between conventional transmission lines 204 and 206 and ground plane 208.

Figure 3:
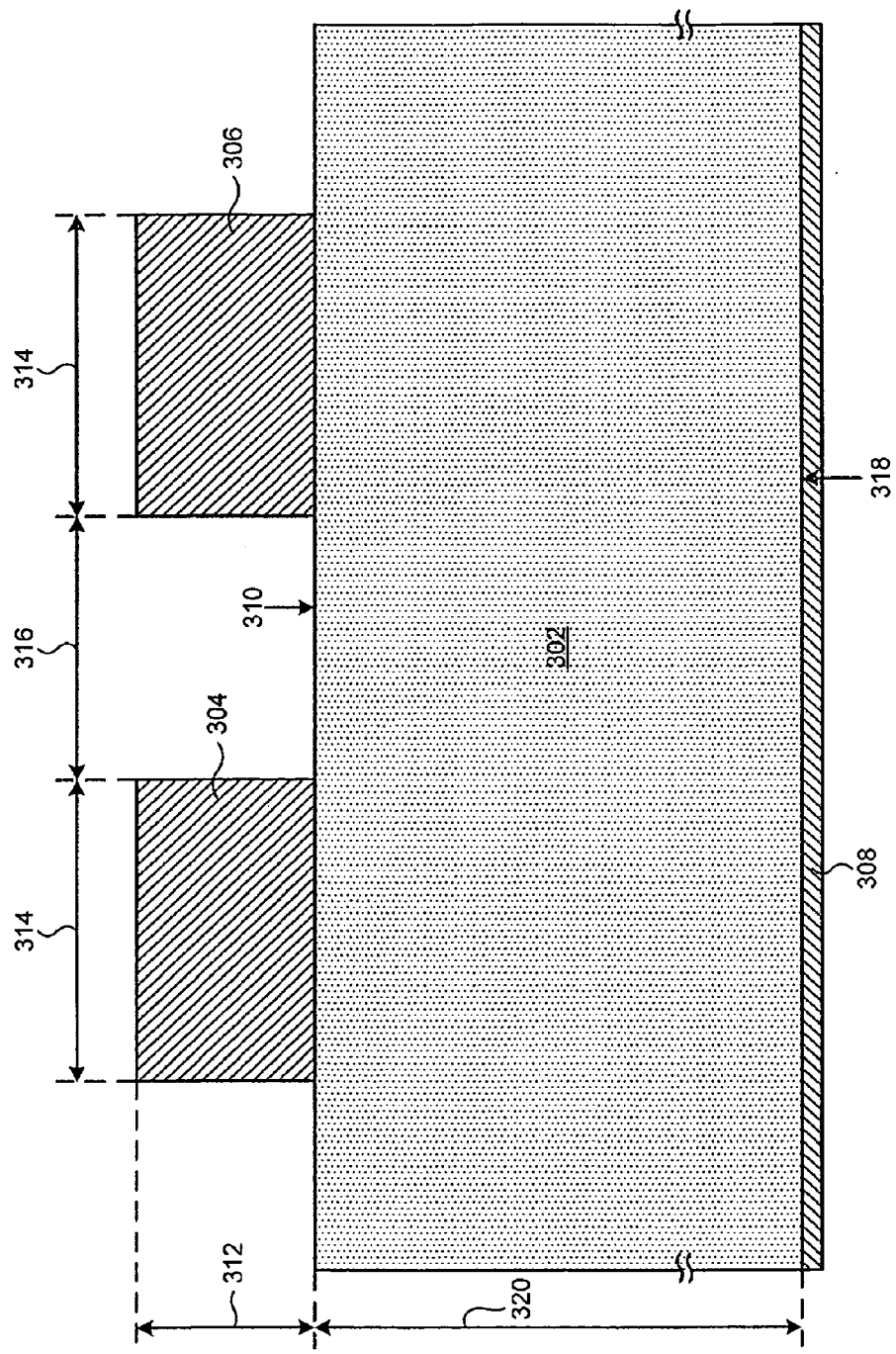
FIG. 3 illustrates a cross-sectional view of an exemplary circuit board including an exemplary pair of transmission lines in accordance with one embodiment of the present invention.

FIG. 3 shows a cross-sectional view of an exemplary circuit board including an exemplary pair of transmission lines in accordance with one embodiment of the present invention. In FIG. 3, circuit board 302 includes transmission lines 304 and 306 and ground plane 308. Circuit board 302 can be utilized for high-speed data transmission in devices, such as optical and Ethernet devices. For example, circuit board 302 can be utilized in Gigabit Ethernet devices. As shown in FIG. 3, transmission lines 304 and 306 are situated on top surface 310 of circuit board 302 and can be a broadside-coupled coplanar pair of transmission lines. In one embodiment, transmission lines 304 and 306 can be utilized in a differential pair configuration. In another embodiment, transmission lines 304 and 306 can be utilized in a single-ended configuration.

Transmission lines 304 and 306 can each comprise, for example, copper and have thickness 312 and width 314. In another embodiment, transmission lines 304 and 306 can comprise a metal other than copper, such as aluminum or gold. Thickness 312 of transmission lines 304 and 306 can be in a range that extends from approximately 1.9 mils, which corresponds to approximately 1.5 ounces of copper, up to approximately 5.3 mils, which corresponds to approximately 4.0 ounces of copper. Width 314 of transmission lines 304 and 306 can be, for example, between 2.0 mils and 8.0 mils. Circuit board 302 can comprise a dielectric material such as FR-4, which is a low-cost dielectric material. In one embodiment, circuit board 302 can comprise a PTFE-based dielectric material, such as Rogers®, which can have a lower insertion loss and a lower dielectric loss than FR-4.

As also shown in FIG. 3, transmission lines 304 and 306 are separated by interpair spacing 316, which represents the edge-to-edge distance between the pair of transmission lines. Interpair spacing 316 can be equal to, for example, approximately 5.2 mils in one embodiment of the invention. However, in other embodiments of the invention, interpair spacing 316 can be less than or greater than 5.2 mils. Further shown in FIG. 3, ground plane 308 is situated on bottom surface 318 of circuit board 302 and can comprise copper or other type of metal. Ground plane 308 is separated from top surface 310 of circuit board 302 by distance 320, which can be at least 50.0 mils. Thus, ground plane 308 is also separated from transmission lines 304 and 306 by at least 50.0 mils. In one embodiment, a signal plane (not shown in FIG. 3) can be situated between transmission lines 304 and 306 and ground plane 308. In one embodiment, a power plane (not shown in FIG. 3), such as a VCC plane, can be situated between transmission lines 304 and 306 and ground plane 308.

By separating transmission lines 304 and 306 by at least 50.0 mils from ground plane 308, the electromagnetic coupling between transmission lines 304 and 306 and ground plane 308 can be substantially reduced in an embodiment of the present invention. Also, by separating transmission lines 304 and 306 by at least 50.0 mils from ground plane 308, an embodiment of the invention's circuit board 302 can comprise FR-4 and still achieve a reduced signal energy loss for high-speed signals traversing transmission lines 304 and 306 compared to conventional board 102, even when conventional circuit board 102 comprises a PTFE-based material, such as Rogers®.

By providing transmission lines 304 and 306 in a thickness ranging from approximately 1.9 mils to approximately 5.3 mils, an embodiment of the invention substantially increases broadside electromagnetic coupling between transmission lines 304 and 306. Also, since transmission lines 304 and 306 are substantially thicker than conventional transmission lines 104 and 106 in conventional circuit board 102 in FIG. 1, an embodiment of the invention substantially reduces conductor loss (i.e. I (current)·R (resistance) loss) for signals traversing through transmission lines 304 and 306 compared to conventional transmission lines 104 and 106.

Thus, by substantially increasing transmission line thickness and by substantially increasing the separation distance between the transmission lines and an underlying ground plane, an embodiment of the invention's circuit board 302 achieves a significant reduction in total loss of energy for signals traversing the transmission lines compared to conventional circuit board 102, even when conventional circuit board 102 comprises a PTFE-based material, such as Rogers®, and circuit board 302 comprises FR-4.

Also, a dielectric material such as FR-4 can cause jitter and reduced "eye opening" amplitude, which can undesirably affect high-to-low and low-to-high transitions of signals traversing the transmission lines. The jitter and "eye opening" amplitude can be determined through the use of an eye pattern in a manner known in the art. However, by substantially increasing transmission line thickness and by substantially increasing the separation distance between the transmission lines and an underlying ground plane, an embodiment of the invention's circuit board 302 can comprise FR-4 and also achieve reduced jitter and increased eye opening amplitude compared to conventional circuit board 102 in FIG. 1. By increasing the eye opening amplitude, an embodiment of the invention's circuit board can achieve more precise high-to-low and low-to-high signal transitions compared to conventional circuit board 102.

Thus, by substantially increasing transmission line thickness and by substantially increasing the separation distance between the transmission lines and an underlying ground plane, an embodiment of the invention can provide reduced dielectric loss, conductor loss, and insertion loss compared to a conventional circuit board with a conventional pair of transmissions while also utilizing a low-cost dielectric material such as FR-4 to advantageously reduce manufacturing cost.

Figure 4:
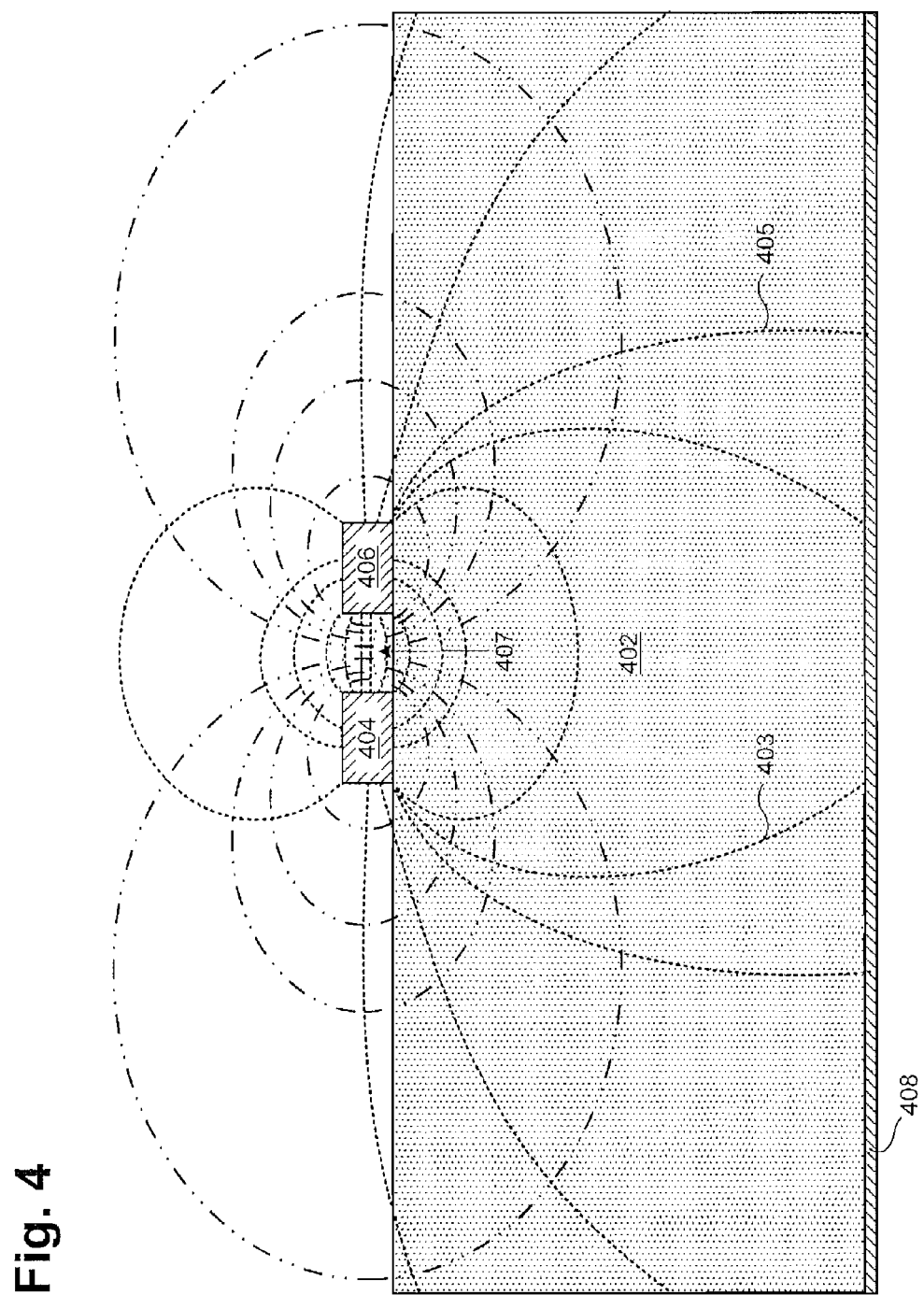
FIG. 4 illustrates a cross sectional view of an exemplary circuit board including an exemplary pair of transmission lines with associated electric and electromagnetic fields in accordance with one embodiment of the present invention.

FIG. 4 shows a cross-sectional view of an exemplary circuit board including a pair of exemplary transmission lines with associated electric and electromagnetic fields in accordance with one embodiment of the present invention. In FIG. 4, circuit board 402, transmission lines 404 and 406, and ground plane 408 correspond, respectively, to circuit board 302, transmission lines 304 and 306, and ground plane 308 in FIG. 3. As shown in FIG. 4, substantial broadside electromagnetic coupling is provided between transmission lines 404 and 406. As a result of the increased thickness of transmission lines 404 and 406, the broadside electromagnetic coupling provided between transmission lines 404 and 406 is significantly greater than the broadside coupling between conventional transmission lines 204 and 206 in FIG. 2.

As also shown in FIG. 4, the electric and electromagnetic fields generated by transmission lines 404 and 406 are concentrated in region 407, which is situated between transmission lines 404 and 406. As a result, EMI (electromagnetic interference) generated by transmission lines 404 and 406 is significantly reduced compared to EMI generated by conventional transmission lines 204 and 206 in FIG. 2. Further shown in FIG. 4, transmission lines 404 and 406 are sufficiently separated from ground plane 408 so as to cause negligible electromagnetic coupling to ground plane 408 relative to the substantial broadside electromagnetic coupling between transmission lines 404 and 406 in region 407. Thus, in the embodiment shown in FIG. 4, only a few electromagnetic field lines, such as electromagnetic field lines 403 and 405, provide coupling between transmission lines 404 and 406 and ground plane 408. In contrast, substantial electromagnetic coupling occurs between conventional transmission lines 204 and 206 and ground plane 208 in conventional circuit board 202 in FIG. 2.

By significantly reducing electromagnetic coupling between transmission lines 404 and 406 and ground plane 408 and significantly reducing EMI generated by transmission lines 404 and 406 by concentrating electromagnetic coupling between transmission lines 404 and 406, an embodiment of the invention's circuit board also provides a reduced loss of electromagnetic energy compared to conventional circuit board 202 in FIG. 2.

Figure 5:
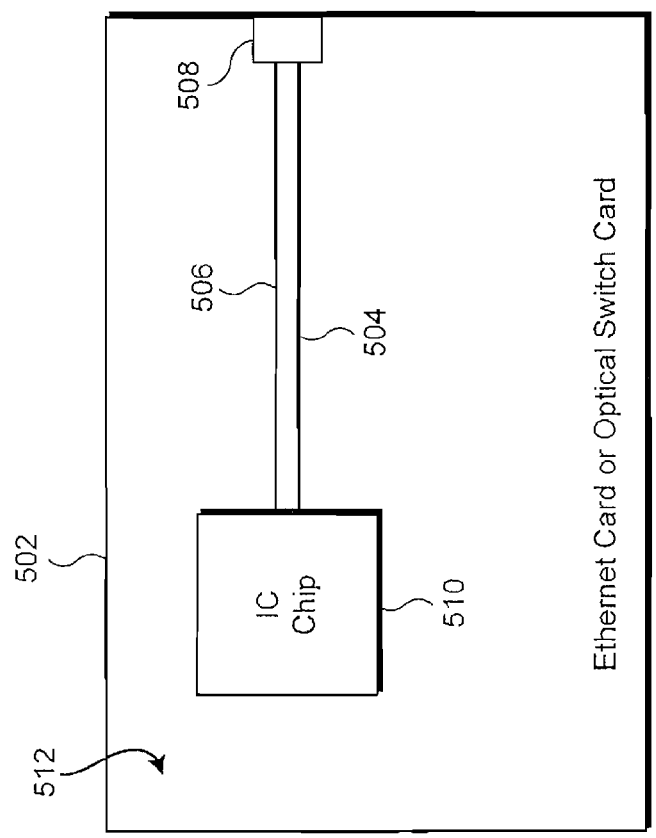
FIG. 5 illustrated a diagram of an exemplary communications system in accordance with one embodiment of the present invention.

FIG. 5 shows a diagram of an exemplary communications system including an exemplary circuit board in accordance with one embodiment of the present invention. In FIG. 5, communications system 500 includes circuit board 502, which includes transmission lines 504 and 506 and input/output (I/O) port 508, and integrated circuit (IC) chip 510. Communications system 500 can include additional components and devices, which are not shown in FIG. 5 so as to preserve brevity in the patent application. As shown in FIG. 5, IC chip 510, which can be a communications IC chip, transmission lines 504 and 506, and I/O port 508 are situated on top surface 512 of circuit board 502, where IC chip 510 is electrically connected to I/O port 508 by transmission lines 504 and 506.

Circuit board 502 can be substantially similar in composition and thickness to circuit board 302 in FIG. 3. Also, circuit board 502 can include a ground plane (not shown in FIG. 5), such as ground plane 318 in FIG. 3, which is situated at least 50.0 mils below top surface 512 of circuit board 502. Transmission lines 504 and 506 can be substantially similar in composition, thickness, and interpair spacing to transmission lines 304 and 306 on circuit board 302. Thus, the thickness of each of transmission lines 504 and 506 can be in a range extending from approximately 1.9 mils up to approximately 5.3 mils. Transmission lines 504 and 506 can be a coplanar pair of transmission lines, which can be utilized in a differential pair configuration in an embodiment of the invention. In one embodiment, transmission lines 504 and 506 can be utilized in a single-ended configuration.

In one embodiment, circuit board 502 can be an Ethernet card and transmission lines 504 and 506 can drive I/O port 508, which can be connected to a server (not shown in FIG. 5). I/O port 508 can be, for example, an RJ-45 jack. Transmission lines 504 and 506 can be utilized for transmitting high-speed Ethernet signals, such as Gigabit Ethernet signals. In one embodiment, transmission lines 504 and 506 can be utilized for transmitting Ethernet signals at transmission speeds equal to or greater than 10.0 Gigahertz (GHz). In an embodiment in which circuit board 502 is an Ethernet card, circuit board 502 provides increased Ethernet signal quality from IC chip 510 to I/O port 508, which can be an RJ-45 jack, by reducing dielectric loss, conductor loss, and insertion loss for Ethernet signals traversing through transmission lines 504 and 506.

In one embodiment, circuit board 502 can be an optical switch card and transmission lines 504 and 506 can drive I/O port 508, which can be connected to an optical module (not shown in FIG. 5). The optical module can be, for example, a small form factor pluggable optical module, such as an SFP+ or an XFP optical module. In an embodiment in which circuit board 502 is an optical switch card, IC chip 510 can be connected to a switch IC chip (not shown in FIG. 5) by another pair of transmission lines similar to transmission lines 504 and 506.

Thus, similar to circuit board 302 in FIG. 3, circuit board 502 also provides reduced dielectric loss, conductor loss, and insertion loss for signals traversing through transmission lines 504 and 506. Also, by reducing dielectric loss, conductor loss, and insertion loss for signals traversing through transmission lines 504 and 506, an embodiment of the invention's circuit board 302 also reduces power consumption of IC chip 510.

Thus, as discussed above, an embodiment of the present invention provides a circuit board including a pair of broadside-coupled transmission lines having a substantially increased thickness compared to conventional transmission lines, where the pair of broadside-coupled transmission lines is separated by a substantially greater distance from an underlying ground plane than the conventional transmission lines on a conventional circuit board. As a result, the invention's circuit board achieves reduced dielectric loss, conductor loss, and insertion loss for signals traversing through the pair of transmission lines compared to a conventional circuit board. By reducing dielectric loss, conductor loss, and insertion loss for signals traversing through the pair of transmission lines, the invention's circuit board can comprise a low-cost dielectric material, such as FR-4, thereby significantly reducing manufacturing cost.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. An Ethernet card for reducing dielectric loss, conductor loss, and insertion loss for signals traversing through a pair of transmission lines in said Ethernet card, said Ethernet card comprising:

said pair of transmission lines having a thickness to increase broadside electromagnetic coupling between said pair of transmission lines relative to electromagnetic coupling of said pair of transmission lines to a ground plane of said Ethernet card;

said pair of transmission lines being separated from said ground plane of said Ethernet card by at least 50 mils so as to reduce electromagnetic coupling to said ground plane of said Ethernet card relative to said broadside electromagnetic coupling.

2. The Ethernet card of claim 1, wherein said pair of transmission lines is a differential pair.

3. The Ethernet card of claim 1, wherein said pair of transmission lines is a co-planar pair.

4. The Ethernet card of claim 1, wherein said thickness of said pair of transmission lines is between approximately 1.9 mils and approximately 5.3 mils.

5. The Ethernet card of claim 1, wherein said ground plane of said Ethernet card is situated on a bottom surface of said Ethernet card.

6. The Ethernet card of claim 1, wherein each of said pair of transmission lines has a width of between approximately 2.0 mils and approximately 8.0 mils.

7. The Ethernet card of claim 1, wherein said Ethernet card comprises FR-4.

8. The Ethernet card of claim 1, wherein said pair of transmission lines comprises copper.

9. An optical switch card for reducing dielectric loss, conductor loss, and insertion loss for signals traversing through a pair of transmission lines in said optical switch card, said optical switch card comprising:

said pair of transmission lines having a thickness to increase broadside electromagnetic coupling between said pair of transmission lines relative to electromagnetic coupling of said pair of transmission lines to a ground plane of said optical switch card;

said pair of transmission lines being separated from said ground plane of said optical switch card by at least 50 mils so as to reduce electromagnetic coupling to said ground plane of said optical switch card relative to said broadside electromagnetic coupling.

10. The optical switch card of claim 9, wherein said pair of transmission lines drive an input/output port of said optical switch card.

11. The optical switch card of claim 10, wherein said input/output port of said optical switch card is connected to an optical module.

12. The optical switch card of claim 9, wherein said pair of transmission lines is a differential pair.

13. The optical switch card of claim 9, wherein said pair of transmission lines is a co-planar pair.

14. The optical switch card of claim 9, wherein said thickness of said pair of transmission lines is between approximately 1.9 mils and approximately 5.3 mils.

15. The optical switch card of claim 9, wherein said ground plane of said optical switch card is situated on a bottom surface of said optical switch card.

16. The optical switch card of claim 9, wherein each of said pair of transmission lines has a width of between approximately 2.0 mils and approximately 8.0 mils.

17. The optical switch card of claim 9, wherein said optical switch card comprises FR-4.

18. The optical switch card of claim 9, wherein said pair of transmission lines comprises copper.

* * * * *